(12) United States Patent
Blasche et al.

(10) Patent No.: US 10,126,383 B2
(45) Date of Patent: Nov. 13, 2018

(54) RF PULSE ALIGNMENT

(71) Applicants: Mathias Blasche, Buckenhof (DE);
Franz Hebrank, Herzogenaurach (DE);
Wilfried Schnell, Forchheim (DE)

(72) Inventors: Mathias Blasche, Buckenhof (DE);
Franz Hebrank, Herzogenaurach (DE);
Wilfried Schnell, Forchheim (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 563 days.

(21) Appl. No.: 14/614,210

(22) Filed: Feb. 4, 2015

(65) Prior Publication Data
US 2015/0219733 A1    Aug. 6, 2015

(30) Foreign Application Priority Data

Feb. 4, 2014    (DE) .................. 10 2014 201 944

(51) Int. Cl.
*G01R 33/36*    (2006.01)
*G01R 33/48*    (2006.01)
(Continued)

(52) U.S. Cl.
CPC ......... *G01R 33/3607* (2013.01); *G01R 33/48* (2013.01); *G01R 33/5659* (2013.01); *G01R 33/3415* (2013.01); *G01R 33/543* (2013.01)

(58) Field of Classification Search
CPC .............. G01R 33/3607; G01R 33/48; G01R 33/5659; G01R 33/3415; G01R 33/543
(Continued)

(56) References Cited

U.S. PATENT DOCUMENTS 5,275,165 A    1/1994  Ettinger et al.
7,777,485 B2   8/2010  Dumoulin et al.
(Continued)

FOREIGN PATENT DOCUMENTS

CN    102210587 A    10/2011
CN    103135082 A    6/2013
(Continued)

OTHER PUBLICATIONS

German Office Action for related German Application No. 10 2014 201 944.3, dated Apr. 27, 2015, with English Translation.
(Continued)

*Primary Examiner* — Melissa Koval
*Assistant Examiner* — Courtney McDonnough
(74) *Attorney, Agent, or Firm* — Lempia Summerfield Katz LLC

(57) ABSTRACT

An RF pulse alignment method for determining transmit scaling factors used in the control of a magnetic resonance system having a number of radiofrequency transmit channels, via which RF pulse trains are transmitted in parallel during operation, is provided. A common reference pulse train is specified for a number of the radiofrequency transmit channels in the course of the control function. A plurality of candidate images of an object that is to be examined are acquired using different candidate sets of transmit scaling factors. Optimal transmit scaling factors with respect to a predefined criterion are selected for each of the radiofrequency transmit channels based on the acquired candidate images.

18 Claims, 3 Drawing Sheets

(51) Int. Cl.
*G01R 33/565* (2006.01)
*G01R 33/3415* (2006.01)
*G01R 33/54* (2006.01)

(58) Field of Classification Search
USPC .................................................. 324/314, 318
See application file for complete search history.

(56) References Cited

U.S. PATENT DOCUMENTS

| | | | |
|---|---|---|---|
| 2010/0079141 A1* | 4/2010 | Stemmer | G01R 33/4824 324/309 |
| 2011/0187367 A1 | 8/2011 | Feiweier et al. | |
| 2011/0241680 A1 | 10/2011 | Mossnang et al. | |
| 2011/0254546 A1 | 10/2011 | Ritter | |
| 2012/0161766 A1* | 6/2012 | Harvey | G01R 33/5612 324/309 |
| 2013/0134973 A1 | 5/2013 | Fautz | |
| 2013/0253876 A1 | 9/2013 | Pfeuffer et al. | |
| 2013/0257430 A1* | 10/2013 | Ritter | G01R 33/543 324/314 |
| 2013/0285660 A1 | 10/2013 | Ritter | |
| 2013/0287181 A1 | 10/2013 | Li et al. | |
| 2014/0062478 A1* | 3/2014 | Paul | G01R 33/543 324/309 |

FOREIGN PATENT DOCUMENTS

| | | |
|---|---|---|
| CN | 103371825 A | 10/2013 |
| CN | 103371845 A | 10/2013 |
| DE | 102010015066 A1 | 10/2011 |
| DE | 102012207132 B3 | 9/2013 |
| DE | 102012205292 A1 | 10/2013 |
| JP | 2012066149 A | 4/2012 |
| JP | 5164443 B2 | 3/2013 |
| JP | 2013192957 A | 9/2013 |
| WO | WO2011033402 A1 | 3/2011 |

OTHER PUBLICATIONS

Chung Sohae, et al., "Rapid B1+ Mapping Using a Preconditioning rF Pulse with TurboFLASH Readout Magnetic Resonance in Medicine 64," 439-446 (2010).
Grissom William et al., "Spatial Domain Method for the Design of RF Pulses in Multicoil Parallel Excitation," in: Magnetic Resonance in Medicine vol. 56, pp. 620-629, 2006.
Kay Nehrke et al; "DREAM—A Novel Approach for Robust, Ultrafast,Multislice B1 Mapping," Magnetic Resonance in Medicine, vol. 68, pp. 1517-1526, 2012.
Chinese Office Action for Chinese Patent Application No. 201510030335.2 dated Apr. 28, 2017, with English Translation.
Chinese Office Action for Chinese Application No. 201510030335.2, dated Dec. 18, 2017, with English translation.

* cited by examiner

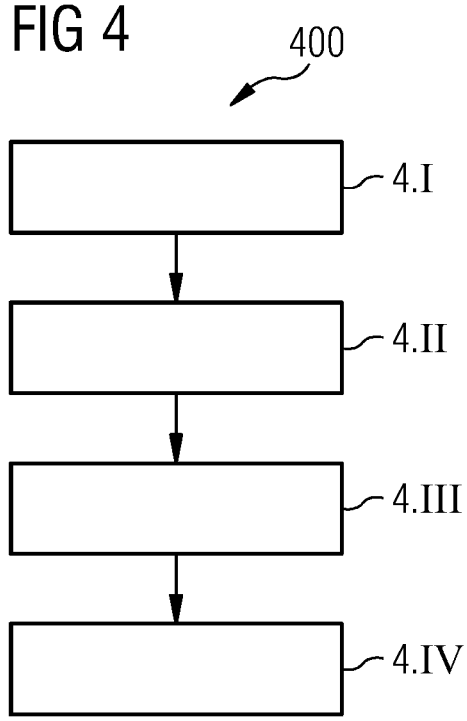
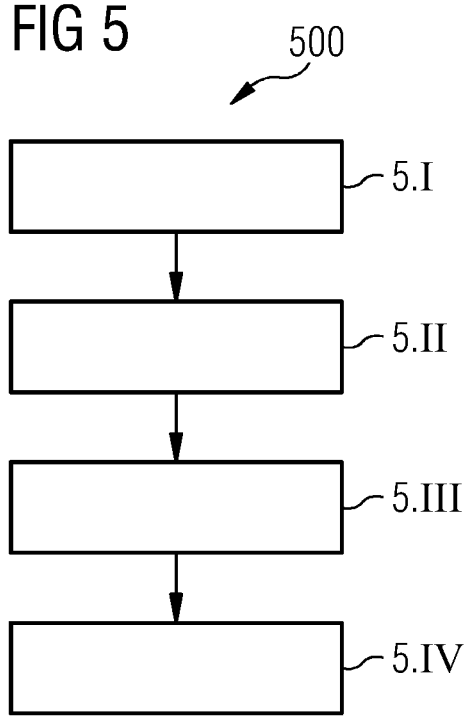

RF PULSE ALIGNMENT

This application claims the benefit of DE 10 2014 201 944.3, filed on Feb. 4, 2014, which is hereby incorporated by reference in its entirety.

BACKGROUND

The present embodiments relate to radio frequency (RF) pulse alignment.

In a magnetic resonance system or magnetic resonance tomography system, the body that is to be examined may be exposed to a relatively high basic magnetic field (e.g., the "$B_0$ field"), of 3 or 7 tesla, for example, with the aid of a basic field magnet system. In addition, a magnetic field gradient is applied with the aid of a gradient system. Radiofrequency excitation signals (RF signals) are then transmitted via a radiofrequency transmit system by suitable antenna devices with the aim of tipping the nuclear spins of certain atoms that have been excited into resonance by the radiofrequency field (e.g., the "$B_1$ field") in a spatially resolved manner through a defined flip angle with respect to the magnetic field lines of the basic magnetic field. The radiofrequency excitation or the resulting flip angle distribution is also referred to hereinbelow as nuclear magnetization, or "magnetization" for short. The correlation between the magnetization m and the $B_1$ field radiated over a time period T is yielded according to $$m \approx 2\pi\gamma \cdot \int_{t=0}^{T} B_1(t)dt \tag{1}$$

where $\gamma$ is the gyromagnetic moment, t the time variable, and $B_1(t)$ is the time-variable magnetic field strength of the $B_1$ field. Upon relaxation of the nuclear spins, radiofrequency signals, called magnetic resonance signals, are emitted, received by suitable receive antennas and then processed further. The desired image data may be reconstructed from the thus acquired raw data. The radiofrequency signals intended to produce the nuclear spin magnetization may be transmitted by a "whole-body coil", also called a "body-coil", or sometimes also by local coils attached to the patient or examination subject. A typical structure of a whole-body coil is a cage-like antenna (e.g., birdcage antenna) including a number of transmit rods running parallel to the longitudinal axis that are arranged around a patient chamber of the tomography system in which a patient is disposed during the examination. At the end faces, the antenna rods are in each case capacitively interconnected in an annular arrangement.

It was standard practice in the prior art to operate whole-body antennas in a circularly polarized (CP) mode. A single temporal RF signal is applied to all the components of the transmit antenna (e.g., to all of the transmit rods of a birdcage antenna). The pulses may be transferred with identical amplitude to the individual components offset in phase by a shift aligned to the geometry of the transmit coil. In a birdcage antenna having 16 rods, for example, the rods may be actuated by the same RF magnitude signal, offset in each case with a 22.5° phase shift. The result is then a circularly polarized radiofrequency field extending in the x/y plane (e.g., perpendicularly to the longitudinal axis of the birdcage antenna extending in the z-direction).

In the interim, the radiofrequency signal that is to be transmitted (e.g., the incoming sequence of radiofrequency pulses (referred to as the "reference pulse train")) may be modified individually in amplitude and phase in each case using a complex transmit scaling factor. The $B_1$ field at a location r (e.g., at a pixel or voxel position r, where r is, for example, a vector having the values of the Cartesian coordinates x, y, z in mm), is given therein according to $$B_1(t) = \sum_{c=1}^{N} E_c(r) \cdot b_c(t) \tag{2}$$

where $b_c(t)$ is an RF curve that is to be transmitted on the channel c=1, ..., N (e.g., the voltage amplitude characteristic (in V) of an RF pulse train over time t), which is given by $b_c(t)=SF_c \cdot b_R(t)$, where $SF_c$ is the complex scaling factor for the channel c and $b_R(t)$ is the voltage characteristic of the reference pulse train. $E_c(r)$ is the sensitivity (in µT/V) of the antenna element of the radiofrequency transmit channel c at a specific location r (e.g., the pixel or voxel position). In this case, $E_c(r)$ is the position-dependent sensitivity distribution in the form of a sensitivity matrix.

In this case too, the antenna may be operated in the "CP mode" by selecting the amplitude at the same level for all transmit channels and only providing a phase shift aligned to the geometry of the transmit coil. Depending on the examination object, an elliptically polarized (EP) mode, in which the radiofrequency field in the x/y plane is elliptically rather than circularly polarized, may also be used. Which mode is used may be dependent on the shape of the body region that is to be excited. In the case of objects that are more cylindrically symmetrical (e.g., in the case of images acquired in the head region), the CP mode is more often selected, whereas the EP mode tends to be chosen in the case of more elliptical shapes (e.g., in the case of examinations in the thoracic or abdominal region). The purpose of the EP mode is to compensate for inhomogenities of the $B_1$ field that are caused by the non-circularly symmetrical body shape. In many cases, a technique known as "$B_1$ shimming" of such a multichannel radiofrequency transmit system is performed. In this case, the individual transmit scaling factors are calculated based on a patient-specific alignment generally with the aim of achieving a particularly homogeneous excitation compared to the prior art standard CP or EP mode.

In this case, the transmit scaling factors are calculated using optimizers that minimize the magnitude deviation of the desired perfectly homogeneous target magnetization m from the theoretically attained actual magnetization A·b:

$$b = \arg_b \min(\|A \cdot b - m\|^2) \tag{3}$$

where A is the so-called design matrix, consisting of a system composed of linearly complex equations into which, inter alia, the spatial transmit profiles of the individual transmit channels (e.g., antenna rods) and the present $B_0$ field distribution are inserted. The design matrix is described, for example, in W. Grissom et al., "Spatial Domain Method for the Design of RF Pulses in Multicoil Parallel Excitation," Mag. Res. Med. 56, 620-629, 2006. In this case, b(t) is the vector of the RF curves $b_c(t)$ that are to be transmitted in parallel. If the solution to Equation (3) (e.g., the minimum of the "target function" defined in Equation (3)) is found, the desired scaling factors $SF_1$, $SF_2$, ..., $SF_N$ are available as the result.

For the purpose of establishing the design matrix, appropriate test measurements are first to be carried out in order to determine the coefficients of the design matrix experimentally. The patient to be examined is to remain in the MRT system for the entire duration of the acquisition and calculation of the data for the design matrix as well as of the optimal values for the vector of the RF curves or for b(t). Thereafter, the patient is also to endure the actual examination in addition, which is very stressful, for example, for sick and enfeebled persons. It is not possible to exit the machine in the interim, since otherwise, the entire alignment process, the B1 shimming, is to be repeated due to the unavoidable change in position of the patient.

SUMMARY AND DESCRIPTION

The scope of the present invention is defined solely by the appended claims and is not affected to any degree by the statements within this summary.

A problem in that due to the alignment of the $B_1$ field to be provided prior to the actual examination of the patient, the patient spends too long in the already confined arrangement of an MRT device and may therefore feel unwell exists. This may lead to a change in position of the patient, for example, and as a result, to a deterioration in image quality or even to the need for a premature termination of the image acquisition if the patient is unable to hold out until the end of the image acquisition.

The present embodiments may obviate one or more of the drawbacks or limitations in the related art. For example, an alternative alignment method as well as a suitable alignment device by which $B_1$ shimming is provided, where the duration of the alignment operation may be reduced.

In a method according to one or more of the present embodiments for alignment of a $B_1$ field of a magnetic resonance system that includes a number (e.g., at least two or more than two) of essentially independently controllable radiofrequency transmit channels via which the parallel RF pulse trains are transmitted during operation, a common reference pulse train is specified in the usual way for a number of the radiofrequency transmit channels (e.g., all of the radiofrequency transmit channels). Also, to be understood by magnetic resonance systems of said kind are, in a simple implementation, "single-channel systems" that are, however, a simple form of a two-channel system. The same RF signal is injected (e.g., as a common reference pulse train) into the antenna on two channels with a phase shift relative to each other that is selectable by hardware and/or software devices (e.g., phase-shifted through 90° in the CP mode and phase-shifted through 135° in the EP mode).

An individual complex transmit scaling factor is determined as a shimming parameter for each of the radiofrequency transmit channels in the RF pulse alignment method taking into account a predefined target magnetization in order to calculate the RF pulse trains for the transmit channels based on the reference pulse train (e.g., as explained hereinabove) to scale or multiply with the reference pulse train for the radiofrequency transmit channel in question.

According to one or more of the present embodiments, however, in the RF pulse alignment method, the transmit scaling factors are not determined by the above-cited complicated calculation of a linear equation system, but instead a series of test images or candidate images of an object that is to be examined is acquired using different candidate sets of transmit scaling factors. Subsequently, transmit scaling factors that are optimal with respect to a criterion are determined for each of the radiofrequency transmit channels based on the acquired candidate images.

For example, 2D images or 3D images may be acquired as test images. The object that is to be examined may be, for example, a patient (e.g., a human being or an animal, or even a mummy) or more generally an object that is difficult to access for direct examination or extremely sensitive with respect to a direct examination.

The cited criterion may be, for example, the homogeneity of the exciting RF field in a target region. It is clear in this case that it is crucial to comply with the maximum permissible $B_1$ field and the maximum permissible SAR (applied specific absorption rate) in all measurements.

The criterion may also be the achievable mean $B_1$ field (e.g., exciting RF field) inside a specific target region that may be achieved as a maximum using the power provided by the RF amplifier without overloading the RF amplifier.

The criterion may also be the applied specific absorption rate (SAR) that is required in a specific target region at a given mean $B_1$ value (e.g., 11.7 µT). The criterion may also include a combination or a specific weighting of a combination of the cited physical variables.

The following approach may be chosen to determine the physical variables corresponding to the cited criteria. The physical variables corresponding to the individual criteria are determined or computed based on the image acquisition or of the respective candidate image. A sequence that is sensitive to the local distribution of the exciting $B_1$ field is chosen. This may advantageously be based on a $B_1$ mapping method (or on $B_1$ mapping sequences) already extensively described in the literature (see, e.g., reference Chung, Kim, Breton and Axel, "Rapid B1+Mapping Using a Preconditioning RF Pulse with TurboFLASH Readout," Magnetic Resonance in Medicine 64:439-446 (2010), and Nehrke and Börnert, "DREAM—A Novel Approach for Robust, Ultrafast, Multislice B1 Mapping," Magnetic Resonance in Medicine 68: 1517-1526 (2012)). Following the acquisition of the candidate images, the $B_1$ distribution is extracted from the respective generated image, where the $B_1$ distributions may be determined using the above-referenced and published $B_1$ mapping methods. If the homogeneity of the test image or candidate image is to be determined, various statistical parameters that represent a metric for the homogeneity of the $B_1$ field in the chosen region of interest are calculated. For example, the quotient is calculated from the difference of the maximum value $B_{1Max}$ and the minimum value $B_{1Min}$ of the magnetic flux density of the $B_1$ field, and the mean value or an average value of the magnetic flux density of the $B_1$ field $B_{1Mean}$ with respect to $(B_{1Max}-B_{1Min})/B_{1Mean}$ or the standard deviation σ or the arithmetic or geometric mean of the error $abs(B_1-B_{1Mean})$.

In the determination of the maximum mean $B_1$ field, the achieved mean $B_1$ value in the target region is ascertained or evaluated. In addition, the maximum RF power required therefore from the RF amplifier is determined from the image acquisition parameters. The maximum available power with the current $B_1$ shim parameterization is calculated taking into account the hardware component protection of the transmit chain (e.g., load situation in the antenna). The values are converted to a maximum mean value of the $B_1$ field under full utilization of the available RF power.

During the determination of the applied specific absorption rate SAR, the achieved mean $B_1$ value in the target region is evaluated. In addition, an evaluation of the SAR applied therefore from the image acquisition parameters is performed. The values are converted to an SAR at a $B_1$ reference value (e.g., 11.7 µT).

Accordingly, a suitable RF pulse alignment device for a magnetic resonance system having a plurality of radiofrequency transmit channels is configured to determine, in the $B_1$ field alignment method or RF pulse alignment method, the transmit scaling factors taking into account a plurality of test images. For this purpose, the RF pulse alignment device has a candidate image generating unit configured to control the magnetic resonance system such that a plurality of candidate images of an object that is to be examined are acquired using different transmit scaling factors assigned to the candidate images. The RF pulse alignment device includes a memory unit for storing the acquired candidate images and the transmit scaling factors assigned to the respective candidate images. The RF pulse alignment device also includes an analysis unit for analyzing the acquired candidate images, and a selection unit for selecting optimal transmit scaling factors with respect to a predefined criterion based on the analysis of the acquired candidate images. The analysis unit and the selection unit may be formed by one or more processors.

In addition to the plurality of radiofrequency transmit channels and the other typical system components such as, for example, a gradient system, a basic field magnet, etc., as well as a control device configured to transmit RF pulse trains in parallel via the radiofrequency transmit channels in order to perform a desired measurement, a magnetic resonance system according to one or more of the present embodiments also includes an RF pulse alignment device.

In the arrangement, the RF pulse alignment device may, for example, be part of the control device of the magnetic resonance system. The RF pulse alignment device may also be located in an external computer connected to the control device (e.g., via a network; an operator terminal or some other computer for exporting compute-intensive operations).

In one embodiment, at least major parts of the RF pulse alignment device may be configured in the form of software. Accordingly, one or more of the present embodiments also include a computer program having instructions that may be loaded directly into a memory (e.g., a non-transitory computer-readable storage medium) of an RF pulse alignment device and/or of a control device. The computer program has program code sections for performing all of the acts of the method according to one or more of the present embodiments when the program is executed in the RF pulse alignment device and/or a control device. Such a realization in the form of software has the advantage that by implementing the program in a suitable manner, it is also possible to modify prior art devices that are used for determining transmit scaling factors or for $B_1$ shimming (e.g., control devices of existing magnetic resonance systems) for the purpose of performing the $B_1$ shimming of the present embodiments.

The description of one category may be developed analogously to the description of a different category. Features of different exemplary embodiments may also be combined with one another in any desired manner.

In a variant of the method, at the time of determining the transmit scaling factors in the RF pulse alignment method, the acquired candidate images are analyzed in the first instance, and then, an optimal candidate image is selected, and the optimal transmit scaling factors with respect to a predetermined criterion are determined based on the information ascertained by analyzing the acquired candidate images.

According to an embodiment of the method, the transmit scaling factors of the candidate set of transmit scaling factors that are assigned to the optimal candidate image with respect to a predetermined criterion are selected as the optimal transmit scaling factors.

This is the simplest embodiment. Alternatively, the optimal transmit scaling factors may also be calculated using the candidate images and the associated transmit scaling factors.

A simple implementation may be realized already in the above-mentioned "single-channel system", in which, for example, only the CP and EP modes are available. For example, the phase shift between the pulses on the two channels may be set also via a switch implemented in hardware.

If such a system is used, the optimal mode for the current patient may be very quickly and easily determined as a function of the acquired candidate images. In this case, only two candidate images are acquired: one for the CP mode and one for the EP mode. In this embodiment of the method, the selection of the optimal candidate image is based on a candidate image generated by a circularly polarized radiofrequency magnetic field and a candidate image generated by an elliptically polarized magnetic field.

The candidate images used in the method according to one or more of the present embodiments may be overview images of the object, for example.

The overview images are topograms (e.g., localizers) used during the preparation for the examination of the object in order to specify the field of vision (e.g., field of view) for the subsequent acquisition, which serves to provide "diagnostic" support (e.g., on a graphical user interface). The overview images may be acquired, for example, in the coronal, sagittal or axial plane.

The candidate images used for the method according to one or more of the present embodiments may reveal different regions and/or views or sectional planes of the object.

In order to specify the field of view, a number of topograms (e.g., a horizontal longitudinal section through the patient and a vertical longitudinal section and possibly also vertical cross-sections) are to be provided. According to an embodiment, these may be used as test images or candidate images provided with different candidate sets of transmit scaling factors.

As a result, the amount of time required and the process-related overhead may be reduced, thus increasing the level of comfort for the patient to be examined and achieving cost savings for the method.

In order to achieve an improved comparability of the candidate images, the same field of view or the same sectional plane may always be used for the acquisition of the candidate images.

According to an embodiment of the method, during the analysis of the candidate images, the acquired candidate images are displayed in a display unit, and a selection signal is received in a signal receiving unit. The signal receiving unit may be a user interface, for example.

The optimal candidate image may also be selected based on an automatic analysis of the acquired candidate images.

The automatic analysis may be realized based on an image optimization algorithm or evaluation algorithm.

The evaluation algorithm may include the following sub-acts. According to the evaluation algorithm, the target values or physical variables corresponding to the respective predefined criteria are determined or calculated for each of the acquired scout MR images or candidate images. Depending on the preset default value, the $B_1$ parameter set or set of transmit scaling factors of the candidate image that optimizes a criterion or the weighted superposition of a number of criteria, or of the candidate image that most closely matches the predefined criteria is selected.

In an advanced version, the target criteria and the $B_1$ shim parameters are interpolated between the acquired scout images, and a $B_1$ shim parameter set or a set of transmit scaling factors that is even more optimal is selected.

As already explained hereinabove with reference to Equation (1), the optimization may have been carried out in the prior art such that the target magnetization deviation is minimized in the target function. In addition, the radiofrequency exposure (RF exposure) of the patient may be reduced by a suitable further function term in the target function. The RF exposure is to be limited since an excessively high RF exposure may cause harm to the patient. For this reason, the RF exposure of the patient may also be calculated already in advance during the planning of the radiofrequency pulses that are to be emitted, and the radiofrequency pulses are selected such that a defined limit is not reached. A method for reducing the RF exposure is described in 201202092.

As described above, the limiting of the RF exposure may be realized with the aid of the RF pulse alignment method according to one or more of the present embodiments in that the maximum B1 field is additionally taken into account as a criterion during the analysis of the candidate images.

In other words, during the measurement of the candidate images, an evaluation of the requisite RF power (e.g., how the different transmit scaling factors impact the RF power) may be carried out.

BRIEF DESCRIPTION OF THE DRAWINGS

FIG. 4 is a flowchart illustrating the RF pulse alignment method according to a first alternative exemplary embodiment;

FIG. 5 is a flowchart illustrating the RF pulse alignment method according to a second alternative exemplary embodiment;

DETAILED DESCRIPTION

Figure 1:
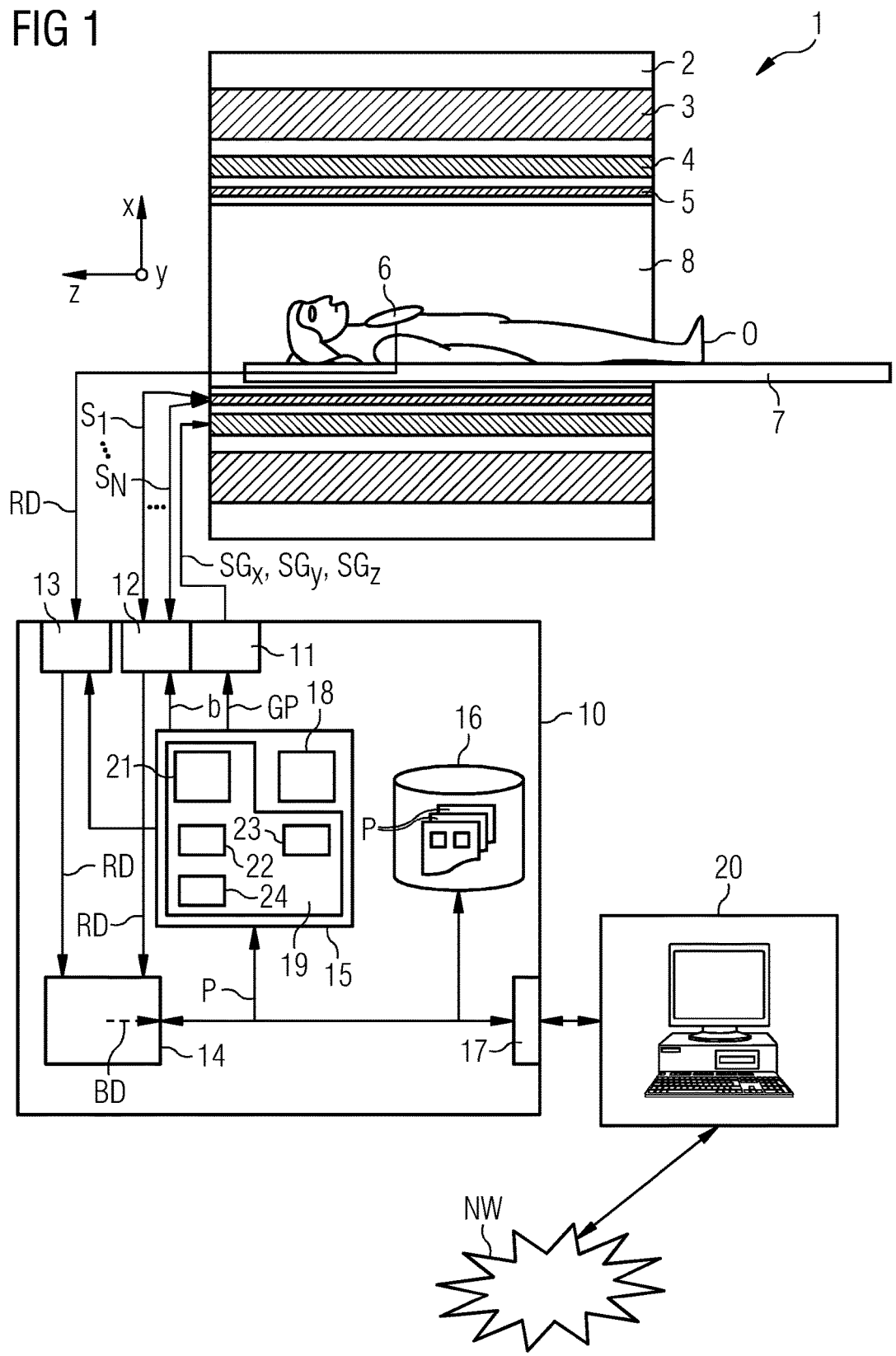
FIG. 1 shows a schematic representation of an exemplary embodiment of a magnetic resonance installation.

FIG. 1 shows a rough schematic view of one embodiment of a magnetic resonance installation 1 or magnetic resonance system 1. The magnetic resonance system 1, for example, includes a magnetic resonance scanner 2 with an examination chamber 8 or patient tunnel 8 located therein. A couch 7 may be introduced into the patient tunnel 8 such that during an examination, a patient O or examination subject lying on the couch 7 may be placed at a specific position inside the magnetic resonance scanner 2 relative to the magnet system and radiofrequency system arranged therein or may also be moved between different positions during a measurement.

Major components of the magnetic resonance scanner 2 are a basic field magnet 3, a gradient system 4 having magnetic field gradient coils in order to apply arbitrary magnetic field gradients in the x-, y- and z-direction, and a whole-body radiofrequency coil 5. Magnetic resonance signals induced in the examination object O may be received via the whole-body coil 5, by which the radiofrequency signals for inducing the magnetic resonance signals may also be transmitted. The signals, however, may be received by local coils 6 placed, for example, on or under the examination object O. All of these components may be known to the person skilled in the art and so are represented merely in roughly schematic form in FIG. 1.

In this example, the whole-body radiofrequency coil 5 is constructed in the form of a birdcage antenna and has a number N of individual antenna rods extending parallel to the patient tunnel 8 and arranged circumferentially in a uniformly distributed manner around the patient tunnel 8. At the end faces, the individual antenna rods are in each case capacitively interconnected in an annular arrangement.

In this case, the antenna rods may be controlled separately as individual transmit channels $S_1, \ldots, S_N$ by a control device 10. The control device 10 may be a control computer that may also include a plurality of individual computers. The plurality of individual computer may be spatially separated and connected to one another via suitable cables or the like. The control device 10 is connected via a terminal interface 17 to a terminal 20 via which an operator may control the entire system 1. In the present case, the terminal 20 is equipped as a computer with keyboard, one or more screens, and further input devices such as, for example, a mouse or the like, thus providing the operator with a graphical user interface.

The control device 10 includes, for example, a gradient control unit 11 that may include a number of subcomponents. Control signals $SG_x$, $SG_y$, $SG_z$ are applied to the individual gradient coils via the gradient control unit 11. The control signals are, for example, gradient pulses that are set during a measurement at precisely designated positions in time and with a precisely predefined temporal progression.

The control device 10 also includes a radiofrequency transmit/receive unit 12. The RF transmit/receive unit 12 also includes a number of subcomponents in order to apply radiofrequency pulses in each case separately and in parallel to the individual transmit channels $S_1, \ldots S_N$ (e.g., to the individually controllable antenna rods of the whole-body radiofrequency coil 5). Magnetic resonance signals may also be received via the transmit/receive unit 12. This happens, however, with the aid of the local coils 6. The signals received by the local coils 6 are read out and processed by an RF receive unit 13. The magnetic resonance signals received by the unit or by the whole-body coil using the RF transmit/receive unit 12 are passed on as raw data RD to a reconstruction unit 14. From the raw data, the reconstruction unit 14 reconstructs the image data BD and stores the image data BD in a memory 16 and/or transfers the image data BD via the interface 17 to the terminal 20, thus enabling the operator to view the image data BD. The image data BD may also be stored and/or displayed and evaluated at other locations via a network NW.

The gradient control unit 11, the radiofrequency transmit/receive unit 12 and the receive unit 13 for the local coils 6 are in each case controlled in a coordinated manner by a measurement control unit 15. Using appropriate commands, the measurement control unit 15 provides that a desired gradient pulse train GP is transmitted by suitable gradient control signals $SG_x$, $SG_y$, $SG_z$ and in parallel controls the RF transmit/receive unit 12 such that a multichannel pulse train b is transmitted (e.g., that the appropriate radiofrequency pulses are applied in parallel on the individual transmit channels $S_1, \ldots S_N$ to the individual transmit rods of the whole-body coil 5). In addition, it is provided that at the appropriate point in time, the magnetic resonance signals at the local coils 6 are read out and processed further by the RF receive unit 13 or that any signals at the whole-body coil 5 are read out and processed further by the RF transmit/receive unit 12. The measurement control unit 15 specifies the corresponding signals (e.g., the multichannel pulse train b to the radiofrequency transmit/receive unit 12 and the gradient pulse train GP to the gradient control unit 11) as a function of a control sequence predefined in a control protocol P. All control data to be set during a measurement is stored in the control protocol P.

A plurality of control protocols P for different measurements may be stored in a memory 16. The plurality of control protocols P may be selected by the operator via the terminal 20 and varied as necessary in order then to have available for the currently desired measurement an appropriate control protocol P with which the measurement control unit 15 may operate. Otherwise, the operator may also download control protocols P from a manufacturer of the magnetic resonance system 1, for example, via a network NW and may then modify and use the control protocols P as necessary.

However, the basic execution sequence of such a magnetic resonance measurement and the cited components for its control are known to the person skilled in the art, so will not be discussed in any further detail here. In other respects, such a magnetic resonance scanner 2 and the associated control device 10 may also include a plurality of other components, which will likewise not be explained in detail here.

The magnetic resonance scanner 2 may also be constructed in a different design, with a patient chamber that is open at the side, for example. In principle, the antenna arrangement used for transmitting does not have to be built in the form of a birdcage antenna. The antenna arrangement includes a number of separately controllable transmit channels $S_1, \ldots, S_N$ (e.g., in the simplest case, two transmit channels).

The measurement control unit 15 of the control device 2 includes, in the form of software modules, for example, a reference pulse generating module 18 that initially generates a reference pulse train $b_R$ in accordance with the specifications in the control protocol P. The reference pulse train $b_R$ is to be transmitted in an equivalent manner to the gradient pulses. The reference pulse train $b_R$ is first transferred to an RF pulse alignment device 19, which may likewise be implemented as a software module within the measurement control unit 15. The RF pulse alignment device 19 serves to determine, in an RF pulse alignment method or $B_1$ shimming method, an individual complex transmit scaling factor $SF_1, \ldots, SF_N$ for each of the radiofrequency transmit channels $S_1, \ldots, S_N$. The RF pulse alignment device includes a candidate image generating unit 21 by which the magnetic resonance system 1 is controlled such that a plurality of candidate images KB of an object O that is to be examined are acquired using different transmit scaling factors $SF_1, \ldots, SF_N$ assigned to the candidate images KB. The RF pulse alignment device 19 also includes a memory unit 22 for storing the acquired candidate images KB and the transmit scaling factors $SF_1, \ldots, SF_N$ assigned to the respective candidate images. The memory unit 22 may be part of the memory 16, for example. The memory unit 22 may, however, also be integrated into the measurement control unit 15 or as a storage segment into a different unit in which a storage device is already present or may be integrated. In addition, the RF pulse alignment device 19 includes an analysis unit 23 for analyzing the acquired candidate images KB. As already described, the analysis may be carried out in relation to different criteria using different evaluation methods. The RF pulse alignment device 19 also includes a selection unit 24 for selecting optimal transmit scaling factors $SF_1, \ldots, SF_N$ with respect to a predefined criterion based on the analysis of the acquired candidate images KB. The determined transmit scaling factors $SF_1, \ldots, SF_N$ are each multiplied by the reference pulse train $b_R$.

Figure 2:
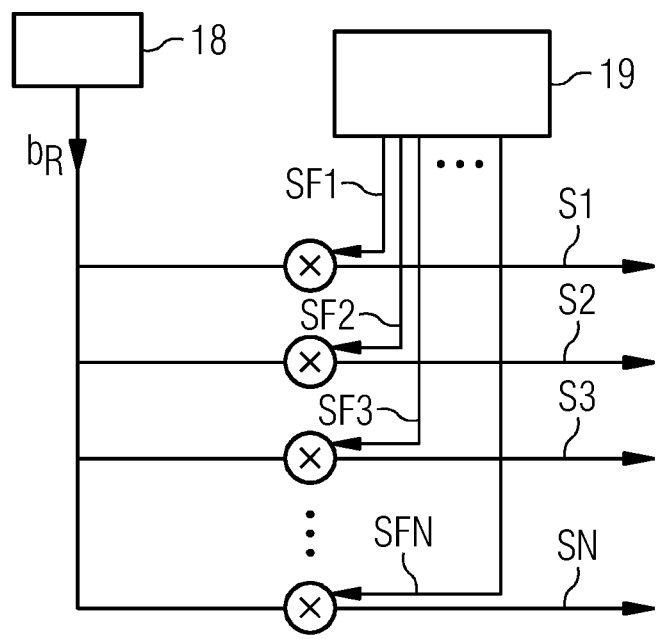
FIG. 2 shows an exemplary $B_1$ shimming method.

The last step in such a $B_1$ shimming method is shown once more schematically in FIG. 2. As shown, the reference pulse train $b_R$ is transferred to the alignment device 19 that, as will be explained again later with reference to FIG. 3, determines the complex transmit scaling factors $SF_1, SF_2, SF_3 \ldots, SF_N$. These, as shown schematically, are multiplied by the reference pulse train $b_R$ in order to obtain the individual pulse trains $b_1, b_2, b_3, \ldots, b_N$, which then collectively form the multichannel pulse train b that is transmitted via the radiofrequency transmit/receive unit 12.

Alternatively, the RF pulse alignment device 19 may, for example, also be implemented separately from the measurement control unit 15 or be part of the radiofrequency transmit/receive unit 12, such that, for example, the multiplication by the complex transmit scaling factors $SF_1, SF_2, SF_3, \ldots, SF_N$ is performed by hardware. Similarly, the reference pulse generating module 18 may also be a separate device or, for example, be part of the radiofrequency transmit/receive unit 12. The reconstruction unit 14 may also include the analysis unit 23 and/or the selection unit 24.

Figure 3:
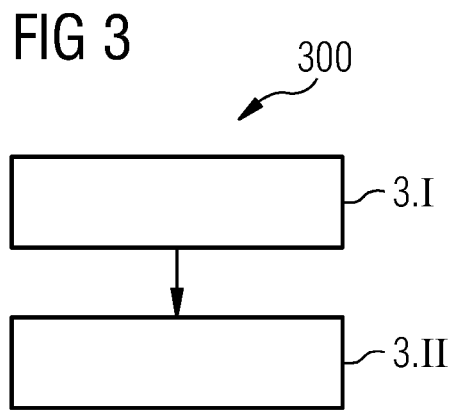
FIG. 3 is a flowchart illustrating an RF pulse alignment method according to an exemplary embodiment.

As shown in the flowchart of FIG. 3, in the method of one or more of the present embodiments, a plurality of candidate images KB of an object that is to be examined are initially acquired at act 3.I using different candidate sets of transmit scaling factors $SF_1, \ldots, SF_N$. At act 3.II, optimal transmit scaling factors $SF_1, \ldots, SF_N$ with respect to a predefined criterion are determined for each of the radiofrequency transmit channels $S_1, \ldots, S_N$ based on the acquired candidate images KB.

The extraction methods described in the literature (see above), also called B1 mapping, already deliver (as described in the above-referenced publications) the quantitative B1 distributions of each candidate image. Depending on the actual problem, criteria for the B1 homogeneity (e.g., particularly obvious and characterized by standard deviation of the B1 values) or threshold values for minimum or maximum B1 values may be applied thereto.

FIG. 4 also shows a flowchart of one embodiment of a method. Act 4.I in FIG. 4 corresponds to act 3.I in FIG. 3. The acquired candidate images (KB) are analyzed at act 4.II. Next, at act 4.III, an optimal candidate image KB is selected, and at act 4.IV, the optimal transmit scaling factors $SF_1, \ldots, SF_N$ are determined based on the information ascertained as a result of the analysis of the acquired candidate images.

FIG. 5 also shows a flowchart of one embodiment of a method. Act 5.I in FIG. 5 corresponds to acts 3.I and 4.I in FIGS. 3 and 4, respectively. In the case of the method 500, however, at the act of the analysis of the acquired candidate images KB, a particularly simple procedure is chosen. The candidate images KB acquired at act 5.II are displayed in a display unit 20, whereupon one of the candidate images is selected, for example, by a person. Following this, at act 5.III, a selection signal is received by a signal receiving unit. At act 5.IV, the optimal transmit scaling factors $SF_1, \ldots, SF_N$ are determined based on the information received with the selection signal. The signal receiving unit may be, for example, a keyboard of a computer of, for example, the terminal 17.

These examples show how an alignment of the $B_1$ field may be accomplished considerably faster and more easily using the method according to one or more of the present embodiments.

The methods and structures described in detail hereintofore are exemplary embodiments, and the basic principle may also be varied in extensive respects by the person skilled in the art without departing from the scope of the invention insofar as disclosed by the claims. The use of the indefinite articles "a" or "an" does not exclude the possibility that the features may also be present more than once. The term "unit" or "module" does not rule out the possibility that these include a number of components that, if necessary, may also be spatially distributed.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A radio frequency (RF) pulse alignment method for determining transmit scaling factors used in control of a magnetic resonance system having a plurality of RF transmit channels, via which RF pulse trains are transmitted in parallel during operation, wherein a common reference pulse train is specified for the plurality of RF transmit channels in the course of a control function, the method comprising:
   acquiring a plurality of test images of an object that is to be examined using different candidate sets of transmit scaling factors for the plurality of RF transmit channels;
   determining, after acquiring the plurality of test images, optimal transmit scaling factors with respect to a predefined criterion for each RF transmit channel of the plurality of RF transmit channels based on the plurality of acquired test images; and
   performing a measurement, the performing comprising transmitting an RF pulse, via the plurality of RF transmit channels, using the determined optimal transmit scaling factors.

2. The method of claim 1, wherein determining the optimal transmit scaling factors comprises:
   analyzing the plurality of acquired test images; and
   selecting an optimal test image from the plurality of acquired test images; and
   determining the optimal transmit scaling factors based on information ascertained as a result of the analysis of the plurality of acquired test images.

3. The method of claim 2, wherein the transmit scaling factors of the candidate set of transmit scaling factors that have been assigned to the optimal test image are selected as the optimal transmit scaling factors.

4. The method of claim 3, wherein selecting the optimal test image is based on a test image generated by a circularly polarized RF magnetic field and a test image generated by an elliptically polarized magnetic field.

5. The method of claim 1, wherein the plurality of test images are overview images of the object.

6. The method of claim 1, wherein the plurality of test images show different regions, views, or regions and views of the object.

7. The method of claim 2, wherein analyzing the plurality of test images comprises:
   displaying the plurality of acquired test images in a display unit; and
   receiving a selection signal in a signal receiving unit.

8. The method of claim 2, wherein the optimal test image is selected based on an automatic analysis of the plurality of acquired test images.

9. A method for controlling a magnetic resonance system having a plurality of radio frequency (RF) transmit channels via which RF pulse trains are transmitted in parallel during operation, wherein a common reference pulse train is specified for a subset of RF transmit channels of the plurality of RF transmit channels, and a transmit scaling factor is determined for each RF transmit channel of the plurality of RF transmit channels in order to calculate the RF pulse trains for the transmit channels based on the reference pulse train, the method comprising:
   determining optimal transmit scaling factors, the determining comprising:
      acquiring a plurality of test images of an object that is to be examined using different candidate sets of transmit scaling factors for the plurality of RF transmit channels; and
      determining, after acquiring the plurality of test images, optimal transmit scaling factors with respect to a predefined criterion for each RF transmit channel of the plurality of RF transmit channels based on the plurality of acquired test images; and
   performing a measurement, the performing comprising transmitting an RF pulse, via the plurality of RF transmit channels, using the determined optimal transmit scaling factors.

10. An RF pulse alignment device for a magnetic resonance system having a plurality of radio frequency (RF) transmit channels, wherein the RF pulse alignment device is configured to determine, for a number of RF transmit channels of the plurality of RF transmit channels, an optimal transmit scaling factor in each case for a reference pulse train specified collectively for the RF transmit channels, the RF pulse alignment device comprising:
   a test image generating unit configured to control the magnetic resonance system such that a plurality of test images of an object that is to be examined are acquired using different transmit scaling factors assigned to the plurality of test images for the plurality of RF transmit channels;
   a memory unit configured to store the plurality of acquired test images and the transmit scaling factors assigned to the respective test images;
   an analysis unit configured to analyze the plurality of acquired test images;
   a selection unit configured to select, after the acquisition of the plurality of test images, optimal transmit scaling factors with respect to a predefined criterion based on the analysis of the plurality of acquired test images,
   wherein the RF pulse alignment device is configured to transmit the selected optimal transmit scaling factors to a control device, the control device being configured to perform a measurement, the performance of the measurement comprising transmission of an RF pulse, via the plurality of RF transmit channels, using the selected optimal transmit scaling factors.

11. The RF pulse alignment device of claim 10, wherein the transmit scaling factors of the candidate set of transmit scaling factors that have been assigned to the optimal test image are selected as the optimal transmit scaling factors.

12. The RF pulse alignment device of claim 11, wherein the selection of the optimal test image is based on a test image generated by a circularly polarized RF magnetic field and a test image generated by an elliptically polarized magnetic field.

13. The RF pulse alignment device of claim 10, wherein the plurality of test images are overview images of the object.

14. A magnetic resonance system comprising:
a plurality of radio frequency (RF) transmit channels;
a control device operable to transmit RF pulse trains in parallel via the plurality of RF transmit channels; and
an RF pulse alignment device configured to transfer determined optimal transmit scaling factors to the control device, wherein the RF pulse alignment device is configured to determine, for a number of RF transmit channels of the plurality of RF transmit channels, an optimal transmit scaling factor in each case for a reference pulse train specified collectively for the RF transmit channels, the RF pulse alignment device comprising:
a test image generating unit configured to control the magnetic resonance system such that a plurality of test images of an object that is to be examined are acquired using different transmit scaling factors assigned to the plurality of test images for the plurality of RF transmit channels;
a memory unit configured to store the plurality of acquired test images and the transmit scaling factors assigned to the respective test images;
an analysis unit configured to analyze the plurality of acquired test images; and
a selection unit configured to select, after acquiring the plurality of test images, optimal transmit scaling factors with respect to a predefined criterion based on the analysis of the plurality of acquired test images,
wherein the control device is configured to transmit an RF pulse, via the plurality of RF transmit channels, using the selected optimal transmit scaling factors, such that a measurement is performed.

15. The magnetic resonance system of claim 14, wherein the transmit scaling factors of the candidate set of transmit scaling factors that have been assigned to the optimal test image are selected as the optimal transmit scaling factors.

16. The magnetic resonance system of claim 15, wherein the selection of the optimal test image is based on a test image generated by a circularly polarized RF magnetic field and a test image generated by an elliptically polarized magnetic field.

17. The magnetic resonance system of claim 14, wherein the plurality of test images are overview images of the object.

18. In a non-transitory computer-readable storage medium storing program code sections having instructions executable by a radio frequency (RF) pulse alignment device to determine transmit scaling factors used in control of a magnetic resonance system having a plurality of RF transmit channels, via which RF pulse trains are transmitted in parallel during operation, wherein a common reference pulse train is specified for a subset of RF transmit channels of the plurality of RF transmit channels in the course of a control function, the instructions comprising:
acquiring a plurality of test images of an object that is to be examined using different candidate sets of transmit scaling factors for the plurality of RF transmit channels;
determining, after acquiring the plurality of test images, optimal transmit scaling factors with respect to a predefined criterion for each RF transmit channel of the plurality of RF transmit channels based on the plurality of acquired test images; and
performing a measurement, the performing comprising transmitting an RF pulse, via the plurality of RF transmit channels, using the determined optimal transmit scaling factors.

* * * * *